(12) United States Patent
Shin et al.

(10) Patent No.: US 7,119,489 B2
(45) Date of Patent: Oct. 10, 2006

(54) ROTATION-MAGNETRON-IN-MAGNETRON (RMIM) ELECTRODE, METHOD OF MANUFACTURING THE RMIM ELECTRODE, AND SPUTTERING APPARATUS INCLUDING THE RMIM ELECTRODE

(75) Inventors: Jai-kwang Shin, Anyang (KR); Seong-gu Kim, Pyeongtaek (KR); Young-kyou Park, Seoul (KR); Hyeon-ill Um, Seongnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 39 days.

(21) Appl. No.: 10/386,940

(22) Filed: Mar. 13, 2003

(65) Prior Publication Data
US 2003/0178299 A1   Sep. 25, 2003

(30) Foreign Application Priority Data
Mar. 14, 2002  (KR) .................. 10-2002-0013938

(51) Int. Cl.
*H01J 25/50* (2006.01)
(52) U.S. Cl. .............................. 315/39.51; 315/111.41; 204/298.2; 118/723 CB
(58) Field of Classification Search ............. 315/39.51, 315/111.81, 111.41, 390; 204/298.2, 298.26, 204/298.12, 298.19, 192.12; 118/723 CB, 118/723 MR, 723 MA, 723 ME
See application file for complete search history.

(56) References Cited
U.S. PATENT DOCUMENTS

| 5,282,947 A | * | 2/1994 | Brugge et al. ........... 204/298.2 |
| 5,770,025 A | | 6/1998 | Kiyota |
| 6,236,163 B1 | * | 5/2001 | Maishev et al. ......... 315/111.81 |
| 6,432,285 B1 | * | 8/2002 | Kastanis et al. ........ 204/298.16 |
| 6,666,957 B1 | * | 12/2003 | Watanabe et al. ....... 204/192.12 |
| 6,692,617 B1 | * | 2/2004 | Fu et al. ................. 204/192.12 |
| 2003/0116432 A1 | * | 6/2003 | Schweitzer et al. ..... 204/298.11 |
| 2003/0209431 A1 | * | 11/2003 | Brown ................... 204/298.19 |
| 2004/0094402 A1 | * | 5/2004 | Gopalraja et al. ...... 204/192.12 |
| 2004/0140204 A1 | * | 7/2004 | Navala et al. ........... 204/298.2 |

FOREIGN PATENT DOCUMENTS

| JP | 62-72121 | * | 4/1987 |
| JP | 02034780 A | * | 2/1990 |
| JP | 6021041 | * | 1/1994 |
| JP | 8-235859 | | 10/1996 |
| JP | 09125241 A | * | 5/1997 |

* cited by examiner

*Primary Examiner*—Trinh Vo Dinh
(74) *Attorney, Agent, or Firm*—Lee & Morse, P.C.

(57) ABSTRACT

An RMIM electrode, a method for manufacturing the RMIM electrode, and a sputtering apparatus using the RMIM electrode, wherein the RMIM electrode includes a magnet unit including a cylinder-shaped magnet located at a center of the magnet unit and a plurality of ring-shaped magnets having increasingly larger diameters surrounding the cylinder-shaped magnet; and a driver unit for supporting and for off-axis-rotating the magnet unit, wherein in the magnet unit, adjacent magnets have opposite magnetization directions.

18 Claims, 13 Drawing Sheets

ROTATION-MAGNETRON-IN-MAGNETRON (RMIM) ELECTRODE, METHOD OF MANUFACTURING THE RMIM ELECTRODE, AND SPUTTERING APPARATUS INCLUDING THE RMIM ELECTRODE

BACKGROUND OF THE INVENTION

1. Field of the Invention

The present invention relates to a rotation-magnetron-in-magnetron (RMIM) electrode, a method of manufacturing the RMIM electrode, and a sputtering apparatus including the RMIM electrode. More particularly, the present invention relates to an RMIM electrode appropriate for a semiconductor device technique providing a high integration density and a low line width and a large-sized wafer process in a magnetron sputtering method, a method of manufacturing the RMIM electrode, and a sputtering apparatus having the RMIM electrode.

2. Description of the Related Art

Physical vapor deposition (PVD) and chemical vapor deposition (CVD) are generally used to manufacture thin films having a fine thickness. In a CVD method, a thin film having desired characteristics is obtained through chemical reactions. Alternately, in a PVD method, a thin film is formed by applying energy to a desired material so that the desired material gains kinetic energy and can then be deposited on a wafer.

In general, there are two different types of CVD methods, i.e., sputtering and evaporation. In an evaporation method, a solid or liquid is heated so that it can be divided into molecules or atoms, and then the molecules or atoms are condensed on the surface of a wafer. An evaporation apparatus has been widely used to manufacture semiconductor devices because it has a simple structure and can be applied to a variety of materials.

A second CVD method, sputtering, is a method of depositing a thin film on a wafer in which particles having a high energy are made to collide with a target formed of a desired material, thereby causing the desired material to be emitted from the target and deposited on the wafer. Sputtering can be used to form a thin film having a relatively uniform thickness on a large area and is easier than other deposition methods to control a composition ratio of a thin film when forming the thin film of an alloy. Therefore, sputtering has been widely adopted in the manufacture of semiconductor devices, such as dynamic random access memory (DRAM), static random access memory (SRAM), non-volatile memory (NVM), LOGIC, and other electronic devices.

There are various types of sputtering, including a bipolar sputtering method and a magnetron sputtering method, which are the most widely used methods. Use of a radio frequency (RF) or direct current (DC) bipolar sputtering method is simple, however, it takes a relatively long time to form layers, and during the formation of the layers, an increase in temperature, damage to layers, or component separation may occur. In order to solve the disadvantages of the bipolar sputtering method, the magnetron sputtering method has been developed.

The magnetron sputtering method is a method of generating high-density plasma by applying a parallel magnetic field onto the surface of a target and thus trapping electrons in an area near a cathode, i.e., the target. In the magnetron sputtering method, unlike in the bipolar sputtering method, it is possible to deposit layers at high speeds and prevent the temperature of a wafer from increasing by controlling secondary electrons. In addition, in the magnetron sputtering method, a high-density plasma environment with a low pressure can be generated inside a reactor using a magnetic field, and thus step coverage can be improved by promoting a tendency of sputtering particles to travel straight so that the sputtering particles can be effectively deposited on a region having a step difference.

FIG. 1 is a diagram illustrating a conventional magnetron sputtering apparatus. Referring to FIG. 1, a wafer holder 19 on which a wafer 17 is mounted is placed inside a vacuum chamber 21, and a target 11 is placed facing the wafer holder 19. In the magnetron sputtering apparatus, magnets 15 are arranged on a rotation plate 29 behind the target 11, thus generating magnetic field lines in a predetermined direction. In addition, a power supply 27 is provided outside the vacuum chamber 21 so that voltage can be applied to an electrode 13 on the target 11. A balance weight 16 is provided on one end of a rotation plate 29 to compensate for the weight of the magnets 15 so that the rotation plate 29 can rotate in balance.

If the chamber 21 is maintained at a predetermined vacuum level, an inert gas, such as argon, is inserted into the chamber 21, and then an electric discharge occurs due to a negative voltage applied to the electrode 13. As a result of the electric discharge, plasma comprised of ionized gas molecules, neutral molecules, and electrons is generated inside the chamber 21, and the migration speed of the ionized gas molecules is accelerated by the negative voltage so that they finally collide with the target 11. Atoms at the surface of the target 11, having obtained kinetic energy from a collision with the gas molecules, are emitted from the target 11, and the emitted atoms are deposited on the wafer 17 in the form of a thin film. The thickness of the deposited thin film is dependent on the voltage applied to the electrode 13, the level of vacuum in the chamber 21, and the time taken to deposit the thin film.

In the magnetron sputtering method, however, it is very difficult to effectively control the movement of charged particles, particularly secondary electrons in a reactor, which is a critical factor affecting the performance of the magnetron sputtering method. In a case where a horizontal magnetic field is concentrated on a specific region, the target 11 is irregularly etched, and thus particles of the target 11 are deposited on the wafer 17 having an irregular thickness. In addition, it is very difficult for the conventional magnetron sputtering apparatus adopting a magnetron cathode to meet the increasing needs of manufacturing highly integrated devices having a lower line width and processing larger-sized wafers.

A moving magnet-type magnetron sputtering method has been considered superior to other magnetron sputtering methods in terms of film uniformity. FIGS. 2 through 4 are photographs showing various types of conventional moving magnet-type magnetron cathodes. In particular, FIG. 2 is a photograph of a freestyle magnetron cathode, FIG. 3 is a photograph of a collimator deposition system-type magnetron cathode, and FIG. 4 is a photograph of a self-ionized plasma-type single moving magnetron cathode.

These conventional magnetron cathode techniques have proven to be ineffective in processes for a low line width (0.14 μm or below) and a high aspect ratio (5:1 or greater) because they cause asymmetrically deposited thin films, deteriorating film uniformity, and ineffective use of target material accompanied by regionally etching of a target. Previously, there have been significant efforts in the field to improve the conventional cathodes and thus enhance the tendency of target particles to travel straight by improving elements other than a cathode, such as a collimator and a long throw sputter.

SUMMARY OF THE INVENTION

The present invention provides a sputtering apparatus appropriate for semiconductor device techniques providing a high integration density and a low line width and processes dealing with large-sized wafers by optimizing a plasma environment inside a reactor in a magnetron sputtering method.

According to an aspect of the present invention, there is provided a rotation magnetron-in-magnetron (RMIM) electrode including a magnet unit including a cylinder-shaped magnet located at a center of the magnet unit and a plurality of ring-shaped magnets having increasingly larger diameters surrounding the cylinder-shaped magnet; and a driver unit for supporting and for off-axis-rotating the magnet unit, wherein in the magnet unit, adjacent magnets have opposite magnetization directions.

Preferably, the plurality of ring-shaped magnets surrounding the cylinder-shaped magnet comprises a first ring-shaped magnet placed inside a second ring-shaped magnet, and a diameter of the first ring-shaped magnet is smaller than a diameter of the second ring-shaped magnet.

Preferably, the driver unit includes a non-magnetic rotation plate for supporting the magnetic unit; and a rotation axis connected to a center of the non-magnetic rotation plate for off-axis-rotating the non-magnetic rotation plate. Preferably, each of the magnets has an asymmetric shape. Preferably, each of the magnets has a center at a location that is different from a location of a center of any other magnet.

The RMIM electrode may further include a balance weight provided at a surface of the non-magnetic rotation plate for maintaining the non-magnetic rotation plate in balance during rotation of the non-magnetic rotation plate.

Preferably, the plurality of ring-shaped magnets surrounding the cylinder-shaped magnet is two ring-shaped magnets. Alternatively, the plurality of ring-shaped magnets surrounding the cylinder-shaped magnet may be more than two ring-shaped magnets.

According to another aspect of the present invention, there is provided a method for manufacturing an RMIM electrode. The method includes (a) forming a basic RMIM electrode by placing a cylinder-shaped magnet at a center of a magnet unit and arranging a plurality of ring-shaped magnets to surround the cylinder-shaped magnet; (b) deducing places where a horizontal magnetic field component is concentrated by off-axis rotating the basic RMIM electrode; and (c) optimizing the configuration of the basic RMIM electrode by modifying the shapes and arrangement of each of the magnets so that the horizontal magnetic field component is evenly distributed.

Preferably, the plurality of ring-shaped magnets surrounding the cylinder-shaped magnet comprises a first ring-shaped magnet placed inside a second ring-shaped magnet, and a diameter of the first ring-shaped magnet is smaller than a diameter of the second ring-shaped magnet. Preferably, adjacent magnets have opposite magnetization directions.

Preferably, in (b), the magnets are fixed onto a non-magnetic rotation plate and then off-axis-rotated. Preferably, (b) includes manufacturing a sputtering apparatus including the basic RMIM electrode, a target placed over the basic RMIM electrode, and a wafer on which material of the target is to be deposited; performing sputtering on the target by off-axis-rotating the basic RMIM electrode; calculating a distribution of depth to which each portion of the target is etched during sputtering; and deducing places where a horizontal magnetic field component is concentrated based upon the target depth distribution.

According to still another aspect of the present invention, there is provided a sputtering apparatus. The sputtering apparatus includes a first electron unit on which a wafer is mounted; a second electron unit under which a target formed of a predetermined material to be deposited on the wafer is provided; a magnet unit placed behind the second electrode unit, the magnet unit including a cylinder-shaped magnet placed at a center of the magnet unit and a plurality of ring-shaped magnets surrounding the cylinder-shaped magnet; and a driver unit for supporting and for off-axis-rotating the magnet unit, wherein in the magnet unit, adjacent magnets have opposite magnetization directions.

Preferably, the plurality of ring-shaped magnets surrounding the cylinder-shaped magnet comprises a first ring-shaped magnet placed inside a second ring-shaped magnet, and a diameter of the first ring-shaped magnet is smaller than a diameter of the second ring-shaped magnet.

Preferably, the driver unit includes a non-magnetic rotation plate for supporting the magnetic unit; and a rotation axis connected to a center of the non-magnetic rotation plate for off-axis-rotating the non-magnetic rotation plate.

Preferably, each of the magnets has an asymmetric shape. Preferably, each of the magnets has a center at a location that is different from a location of a center of any other magnet.

Preferably, the sputtering apparatus further includes a balance weight provided at a surface of the non-magnetic rotation plate for maintaining the non-magnetic rotation plate in balance during rotation of the non-magnetic rotation plate.

Preferably, the plurality of ring-shaped magnets surrounding the cylinder-shaped magnet is two ring-shaped magnets. Alternatively, the plurality of ring-shaped magnets surrounding the cylinder-shaped magnet may be more than two ring-shaped magnets.

The present invention provides an RMIM electrode adopting an asymmetric multiple magnetic field division method, a method for manufacturing the RMIM electrode, and a magnetron sputtering apparatus using the RMIM electrode. Accordingly, it is possible to meet the needs for providing a lower line width and dealing with a larger-sized wafer in a gap filling process. In addition, it is possible to uniformly etch a target and enhance step coverage and thickness uniformity of a thin film deposited on a wafer in a sputtering process.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-13938, filed Mar. 14, 2002, and entitled, "Rotation-Magnetron-in-Magnetron (RMIM) Electrode, Method of Manufacturing the RMIM Electrode, and Sputtering Aparatus Having the RMIM Electrode," is incorporated by reference herein in its entirety.

Hereinafter, an RMIM electrode and a method for manufacturing the RMIM electrode according to the present invention will be described more fully with reference to the accompanying drawings in which preferred embodiments of the invention are shown. In the present invention, the RMIM electrode may be either an RMIM anode or an RMIM cathode. However, since an RMIM cathode is generally used in a sputtering apparatus, the RMIM electrode and the manufacturing method thereof according to the present invention will be described as an RMIM cathode and a manufacturing method thereof. Thus, it should be understood that the present invention may also be applied to an RMIM anode and a manufacturing method thereof.

Figure 1:
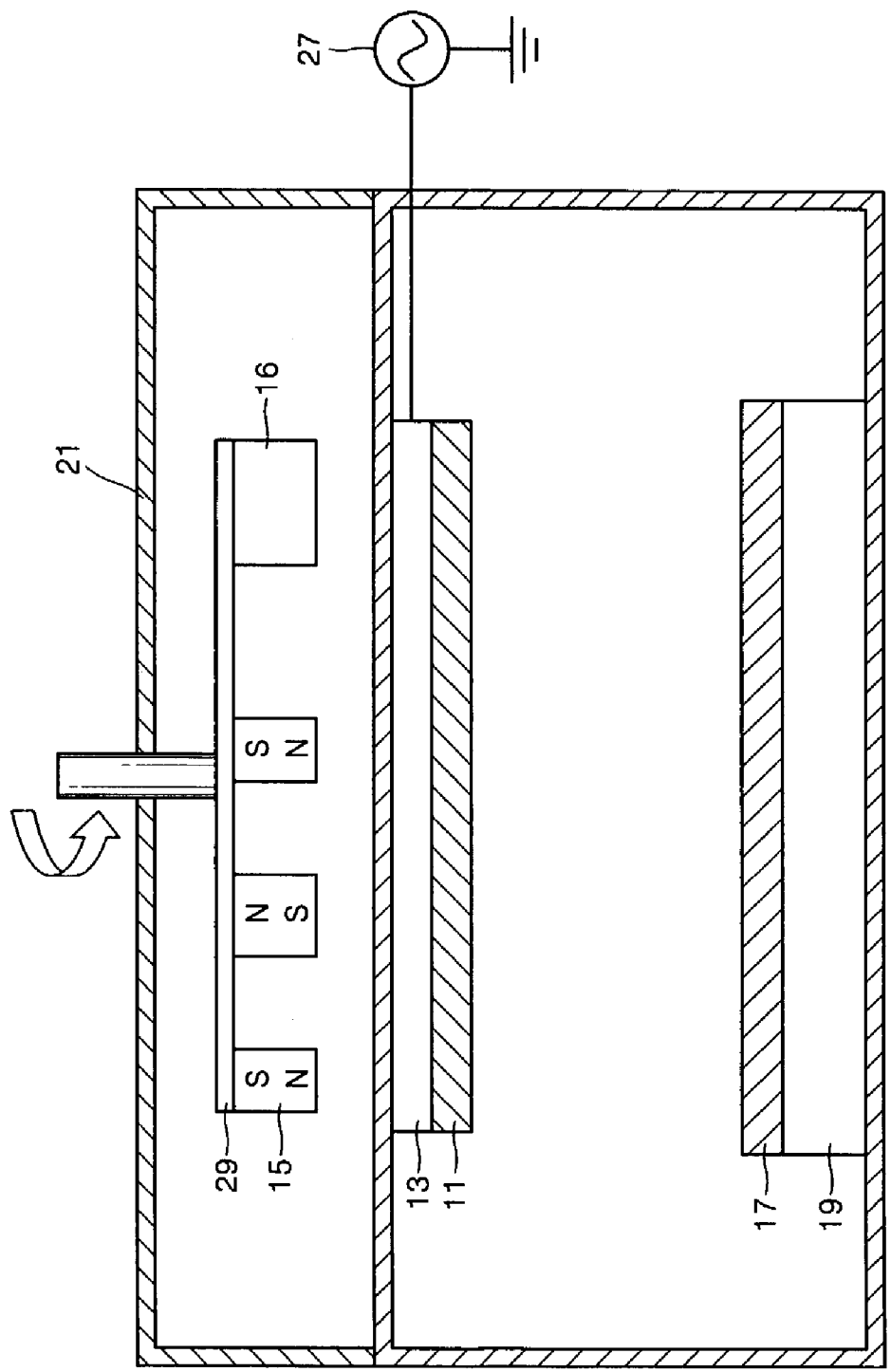
FIG. 1 illustrates a cross-sectional view of a conventional magnetron sputtering apparatus.
Figure 2:
FIG. 2 is a photograph of a conventional free-type magnetron cathode.
Figure 3:
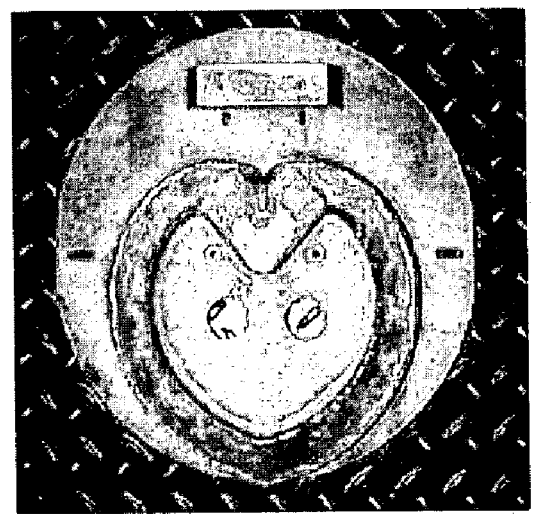
FIG. 3 is a photograph of a conventional collimator deposition system-type magnetron cathode.
Figure 4:
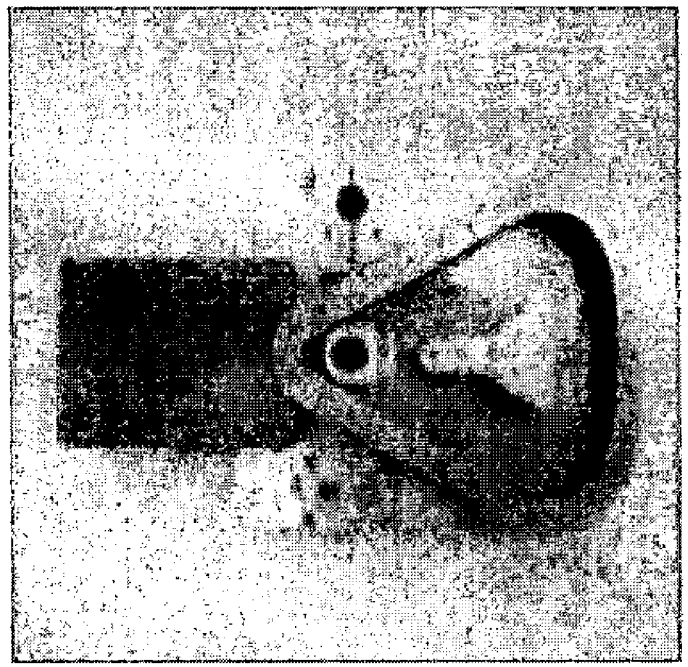
FIG. 4 is a photograph of a conventional self-ionized plasma-type single moving magnetron cathode.
Figure 5A:
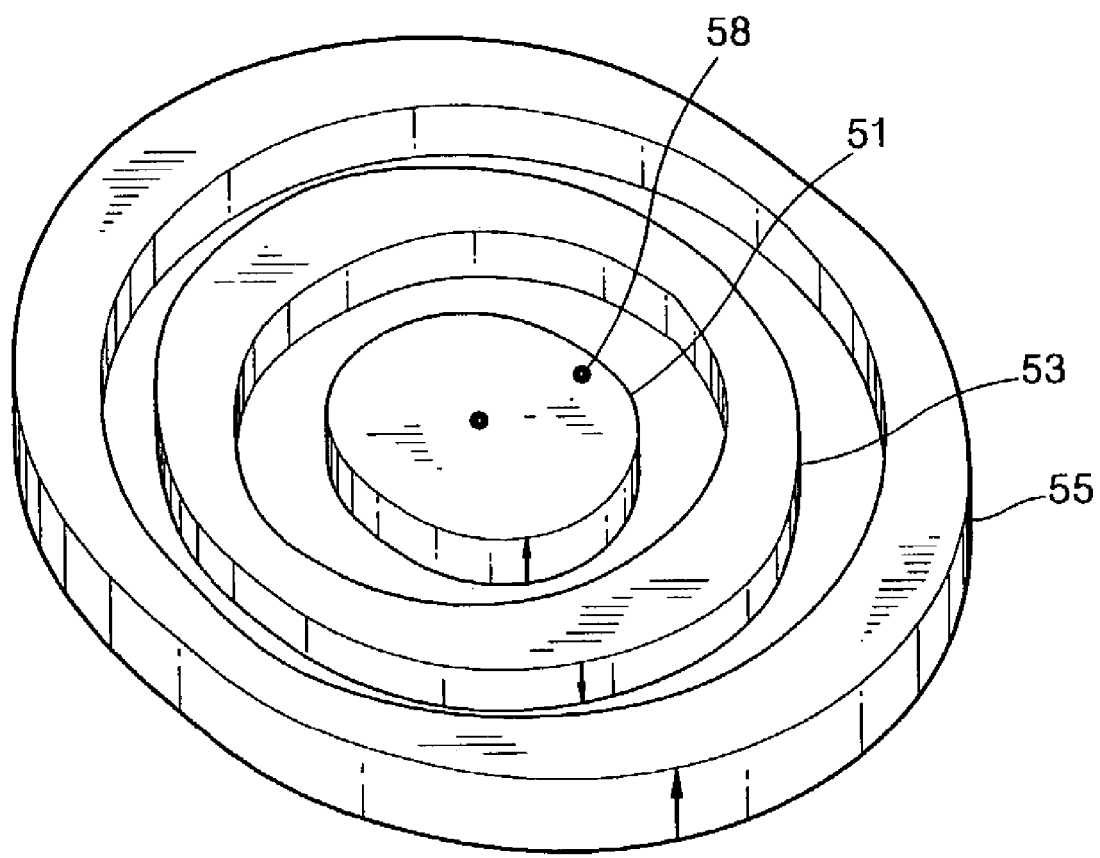
FIG. 5A illustrates a perspective view of a rotation magnetron in a magnetron (RMIM) cathode according to a preferred embodiment of the present invention.
Figure 5B:
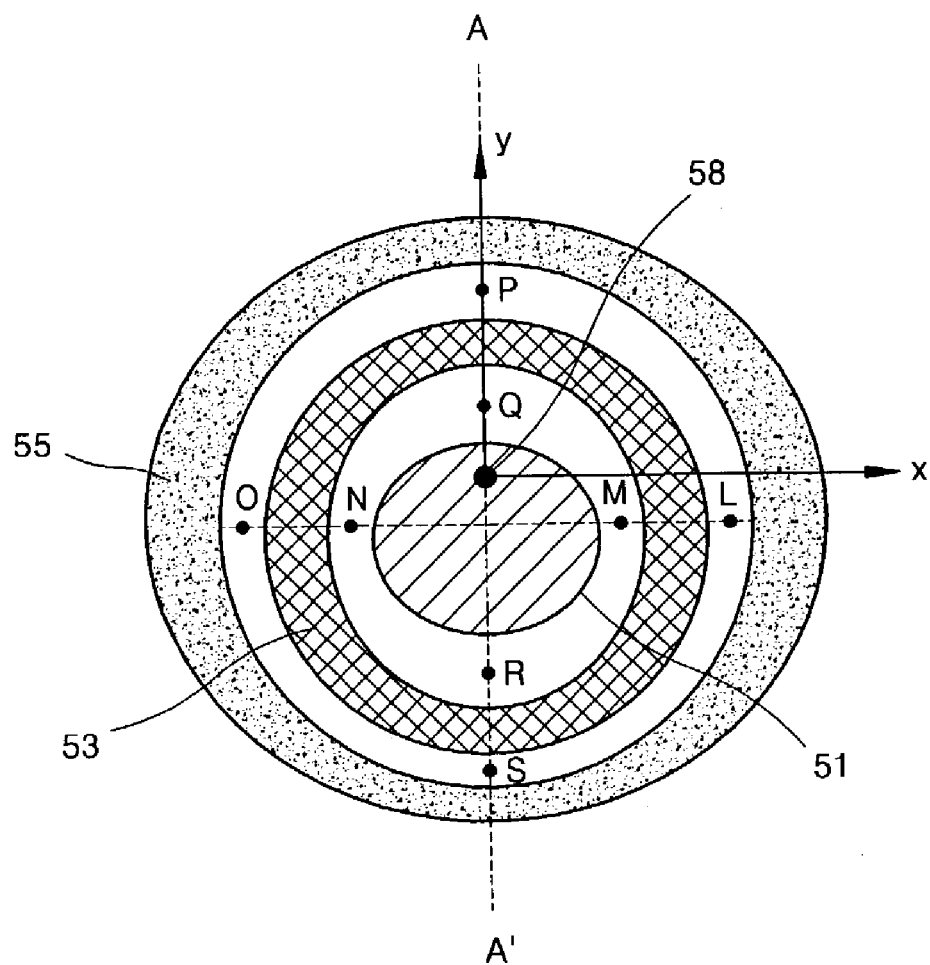
FIG. 5B illustrates a plan view of an RMIM cathode according to a preferred embodiment of the present invention.
Figure 5C:
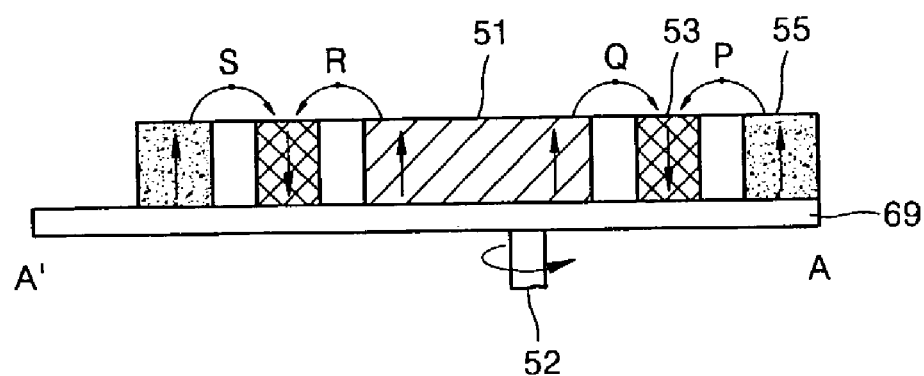
FIG. 5C illustrates a cross-sectional view of an RMIM cathode according to a preferred embodiment of the present invention.

FIGS. 5A through 5C illustrate a perspective view, a plan view, and a side view, respectively, of an RMIM electrode according to a preferred embodiment of the present invention. Referring to FIGS. 5A through 5C, the RMIM electrode includes a cylinder-shaped first magnet 51 placed at a center, a ring-type second magnet 53 inside which the first magnet 51 is located, and a ring-type third magnet 55 inside which the second magnet 52 is located. As will be indicated in the drawings by upward and downward pointing arrows, each of the first through third magnets 51, 53, and 55 have an opposite magnetization direction to their adjacent counterparts so that magnetic field lines can be connected and thus a magnetic field can be generated. In this preferred embodiment, two ring-shaped magnets are provided in the RMIM electrode, however, the number of ring-shaped magnets in the present invention is not limited to two and may be greater than two.

A conventional RMIM electrode has a symmetric structure in which areas where the intensity of a horizontal magnetic field component is high and other areas where the intensity of the horizontal magnetic field component is low appear in a regular manner and are concentrated on specific regions. Accordingly, plasma is also concentrated on the specific regions in the conventional RMIM electrode. Therefore, portions of a target corresponding to the specific regions of the conventional RMIM electrode are more likely to be etched than other portions so that the target as a whole is irregularly etched. However, the RMIM electrode according to the present invention rotates in an asymmetric manner so that the locations of areas where the intensity of a horizontal magnetic field component is high and other areas where the intensity of the horizontal magnetic field component is low continuously vary rather than remaining fixed.

Referring to FIGS. 5A through 5C, the first through third magnets 51, 53, and 55 are each formed having an asymmetric shape so that the outer and inner perimeters of each of the first through third magnets 51, 53, and 55 do not exactly correspond to each other. In addition, the outer and inner perimeters of each of the first through third magnets 51, 53, and 55 have an irregular distance therebetween and are irregularly formed. The geometrical shape of each of the first through third magnets 51, 53, and 55 are sequentially determined by calculations so that a horizontal magnetic field component generated among the first through third magnets 51, 53, and 55 can be evenly distributed rather than being concentrated on a specific region.

Referring to FIG. 5A, the first and third magnets 51 and 55 have an upward magnetization direction, and the second magnet 53 has an opposite magnetization direction, i.e., a downward magnetization direction. Here, the magnetization directions of the first through third magnets 51, 53, and 55 may be set differently from those shown in FIG. 5A. However, in any case, adjacent magnets are to have opposite magnetization directions.

Referring to FIGS. 5A and 5B, the first through third magnets 51, 53, and 55 rotate about a rotation center 58. Rotation around the rotation center 58 is called "off-axis rotation" because the rotation center 58 does not correspond to the center of any of the first through third magnets 51, 53, and 55. The rotation center 58 is offset from each of the centers of the first through third magnets 51, 53, and 55. The optimal placement of the rotation center 58 is determined through a number of experiments so that an asymmetric multiple magnetic field can be strengthened, a target can be evenly etched, and a target material can be deposited on a wafer to have a regular thickness. In FIG. 5B, there are eight places indicated by reference characters between the inner and outer perimeters of each of the first through third magnets 51, 53, and 55 where a horizontal magnetic field component is concentrated. These eight places are represented by reference characters L, M, N, O, P, Q, R, and S.

Since the rotation center 58 and the center of the first magnet 51 are not located at the same position, the places L, M, N, O, P, Q, R, and S rotate in an asymmetric manner, tracing different trajectories so that the horizontal magnetic field component can be evenly distributed rather than being limited to the eight places L, M, N, O, P, Q, R, and S.

FIG. 5C illustrates a cross-sectional view of an RMIM electrode according to a preferred embodiment of the present invention, taken along line A–A' of FIG. 5B. Referring to FIG. 5C, the RMIM electrode includes a driver unit for supporting and for rotating the first through third magnets 51, 53, and 55. The driver unit includes a non-magnetic rotation plate 69 for supporting the first through third magnets 51, 53, and 55 and a rotation axis 52 extending from the rotation center 58, i.e., the center of the non-magnetic rotation plate 69 for inducing off-axis rotation of the non-magnetic rotation plate 69. In addition, a balance weight (56 of FIG. 12) may be further provided on the non-magnetic rotation plate 69 to maintain the non-magnetic rotation plate 69 in balance.

Referring to FIG. 5C, a magnetic field line starting from the first magnet 51 enters the second magnet 53, and a magnetic field line starting from the third magnet 55 enters the second magnet 53. Due to an $\vec{E} \times \vec{B}$ drift, electrons, i.e., plasma, are confined to the surface of a target so that the amount of the target being etched increases.

Referring to FIG. 5B, in a case where the first through third magnets 51, 53, and 55 do not rotate, a horizontal magnetic field component is concentrated on the regions P, Q, R, and S placed along line A–A' of FIG. 5B. However, even in a case where the first through third magnets 51, 53, and 55 rotate about the rotation axis 52, the regions Q and R do not overlap each other, and the regions P and S do not overlap each other because the rotation center 58 does not correspond to the center of the first magnet 51. Therefore, the places P, Q, R, and S where a horizontal magnetic field component is concentrated can be evenly distributed over the entire region of the target by the first through third magnets 51, 53, and 55 rotating about the rotation axis 52. In addition, it is possible to increase the amount of the target being etched by increasing the volume of each of the first through third magnets 51, 53, and 55 and thus increasing the intensity of the horizontal magnetic field component.

Figure 6A:
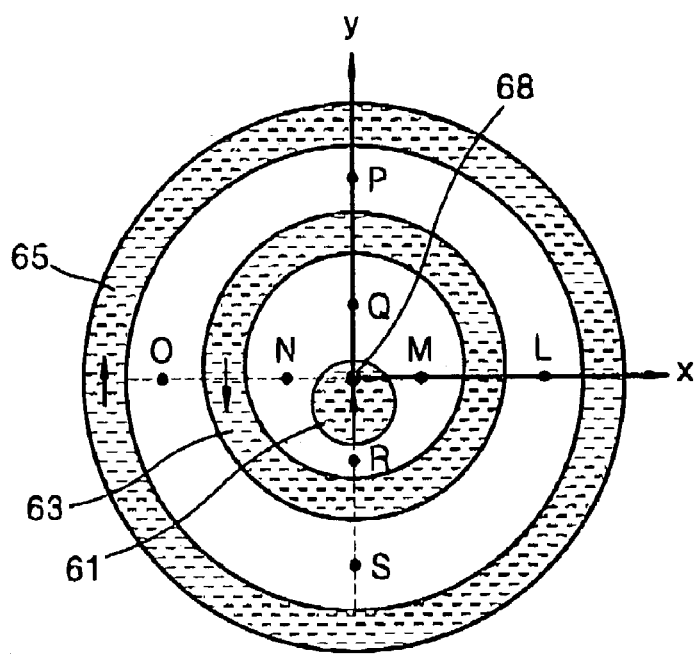
FIG. 6A illustrates a plan view of a basic RMIM cathode according to an embodiment of the present invention.
Figure 6B:
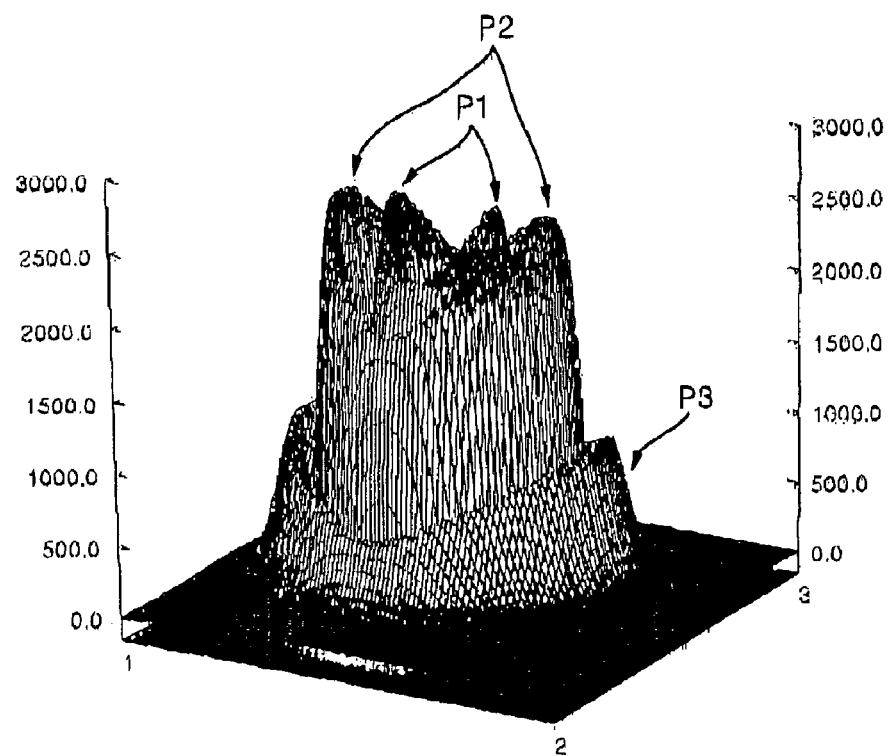
FIG. 6B is a three-dimensional graph showing the intensity and distribution of a horizontal magnetic field component generated on a target by a sputtering apparatus including an optimized RMIM cathode as shown in FIGS. 5A–5C.

FIG. 6A illustrates a plan view of a basic RMIM cathode according to an embodiment of the present invention. FIG. 6B is a graph showing the intensity and distribution of a horizontal magnetic field component generated on a target by a sputtering apparatus including an optimized RMIM cathode as shown in FIGS. 5A–5C.

Referring to FIG. 6A, a basic RMIM cathode includes a first magnet 61 having a cylinder shape, a second magnet 63 having a ring shape and surrounding the first magnet 61, and a third magnet 65 having a ring shape and surrounding the second magnet 65. Prior to optimization, in the basic RMIM electrode, the inner and outer perimeters of each of the second and third magnets 63 and 65 form concentric circles so that a distance therebetween is regular. A center of the first magnet 61, however, is located lower than a center of the second magnet 63, as shown in FIG. 6A. A rotation center 68 of the first through third magnets 61, 63, and 65 is located higher than the center of the first magnet 61.

A horizontal magnetic field component is concentrated on regions M, N, Q, and R between the first magnet 61 and the second magnet 63 and on regions L, O, P, and S between the second magnet 63 and the third magnet 65. When the first through third magnets 61, 63, and 65 do not rotate, the horizontal magnetic field component is stronger at the region R than at any other region. However, when the first through third magnets 61, 63, and 65 rotate, the regions N, M, and Q move circularly, tracing similar trajectories to the trajectory of the region R. Therefore, the horizontal magnetic field component is not always greatest at the region R when the first through third magnets 61, 63, and 65 rotate.

When the first through third magnets 61, 63, and 65 rotate about the rotation center 68, the regions Q and R move circularly, tracing similar trajectories, and the regions N and M move circularly, tracing similar trajectories. In addition, during the rotation of the first through third magnets 61, 63, and 65, regions P, S, L, and O also rotate tracing similar trajectories.

FIG. 6B shows the intensity and distribution of a horizontal magnetic field component generated on a target when the RMIM cathode of FIG. 5B, obtained by optimizing the basic RMIM cathode of FIG. 6A, is at a standstill. In FIG. 6B, peaks P1 and P2 represent horizontal magnetic field components generated at the regions M, N, Q, and R and at the regions L, O, P, and S, respectively, and a peak P3 represents a horizontal magnetic field component generated outside the RMIM cathode.

Figure 7A:
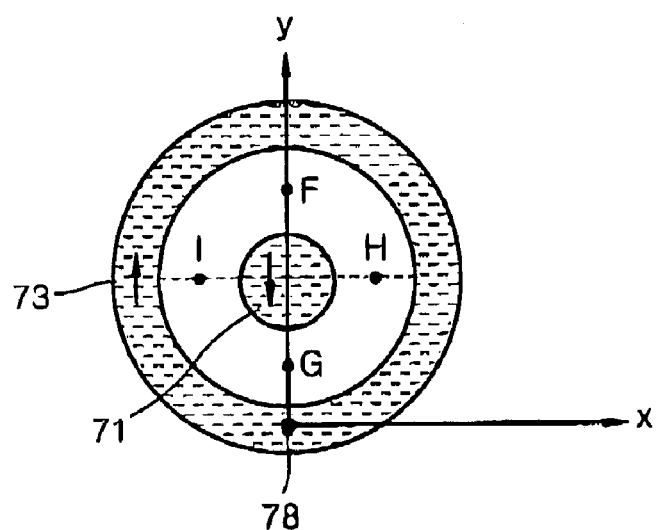
FIG. 7A illustrates a plan view of a conventional magnetron cathode.
Figure 7B:
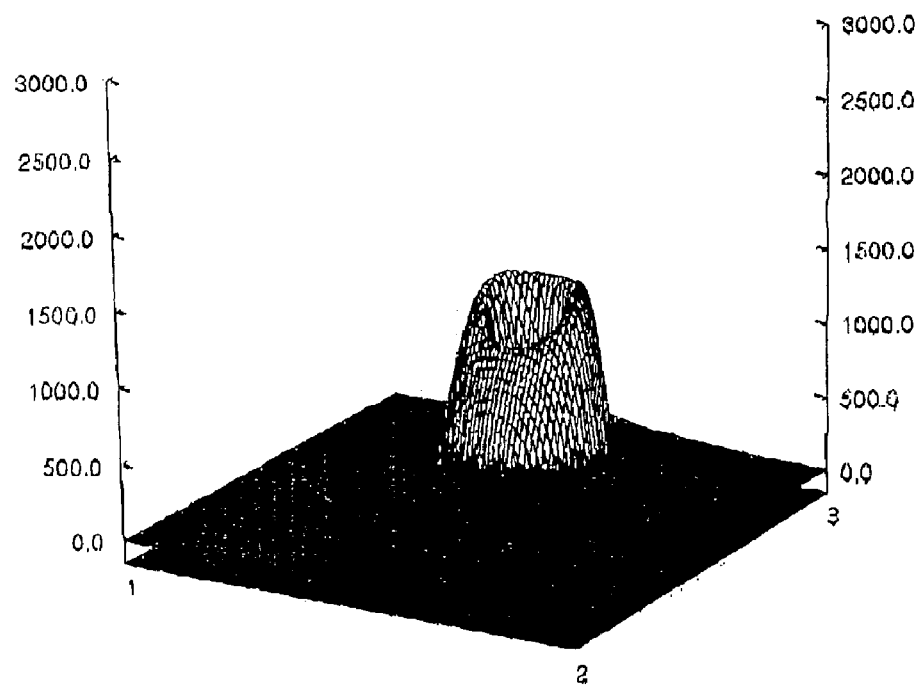
FIG. 7B is a three-dimensional graph showing the intensity and distribution of a horizontal magnetic field component of the conventional magnetron cathode shown in FIG. 7A.

FIG. 7A illustrates a plan view of a conventional ultra low-pressure (ULP) cathode. FIG. 7B is a graph showing the intensity and distribution of a horizontal magnetic field component generated on a target using a sputtering apparatus including the conventional ULP cathode of FIG. 7A.

Referring to FIG. 7A, the conventional ULP cathode includes a first magnet 71 having a cylinder shape and a second magnet 73 surrounding the first magnet 73. The conventional ULP cathode rotates about a rotation center 78, which is located at a lower part of the second magnet 73.

In the conventional ULP cathode shown in FIG. 7A, a horizontal component magnetic region is concentrated on regions F, G, H, and I. Among the regions F, G, H, and I, the region G traces the smallest circle while rotating about the rotation center 78, followed by the regions I and H tracing the next smallest circles. The region F traces the largest circle while rotating about the rotation center 78. The first and second magnets 71 and 73 generate a horizontal magnetic field component having a distribution pattern shown in FIG. 7B. The intensity of the horizontal magnetic field component is highest at the regions F, G, H, and I.

Referring to FIGS. 6B and 7B, the intensity and distribution of a horizontal magnetic field component generated on a target by the RMIM cathode of FIG. 6B has a stronger intensity and a wider distribution than the intensity and distribution of a horizontal magnetic field component generated on a target by the conventional ULP cathode of FIG. 7B. In particular, in FIG. 6B, the horizontal magnetic field component is almost evenly distributed over all space among the first through third magnets 61, 63, and 65. In FIG. 7B, however, the horizontal magnetic field component is concentrated on a space between the first magnet 71 and the second magnet 73.

In the case of performing sputtering using the conventional ULP cathode shown in FIG. 7A, plasma is concentrated on places where the horizontal magnetic field component is concentrated and thus the intensity reaches a peak. Portions of a target corresponding to the places where the horizontal magnetic field component has peak intensity are more likely to be etched, and other portions are less likely to be etched. Therefore, the target as a whole is irregularly etched, and thus target material is deposited on a wafer, being particularly concentrated on a portion of the wafer facing a first magnet 71. Therefore, the target material is irregularly deposited on the wafer thereby degrading the thickness uniformity of a thin film formed of the target material deposited on the wafer.

However, even in the case of using the basic RMIM cathode shown in FIG. 6A, a horizontal magnetic field component is not evenly distributed over a target. Therefore, it is necessary to make alterations to the geometrical shape of the basic RMIM cathode and change the location of a rotation center, i.e., to optimize the design of the basic RMIM cathode.

Therefore, in a method for manufacturing an RMIM cathode according to a preferred embodiment of the present invention, which will now be described, alterations are sequentially made to the geometrical shape of the basic RMIM cathode shown in FIG. 6A, thus forming an optimized RMIM cathode adopting asymmetric multiple magnetic field division, as shown in FIGS. 5A through 5C. Therefore, a target is entirely evenly etched, the amount of the target etched is increased, and the thickness of a thin film formed of target material on a wafer is made to be even.

FIGS. 8A, 9A, 10A, and 11A illustrate plan views of different iterations of a RMIM cathode manufactured in a method for manufacturing an RMIM cathode according to a preferred embodiment of the present invention. FIGS. 8B, 9B, 10B, and 11B are graphs showing etched target profiles obtained using the iterations of the RMIM cathode shown in FIGS. 8A, 9A, 10A, and 11A, respectively.

In a method for manufacturing an RMIM cathode according to a preferred embodiment, the intensity and distribution of a horizontal magnetic field component formed over the surface of a target directly affect an etched target profile. Therefore, an RMIM cathode is preferably optimized by carrying out a simulation of the variation of the etched target profile with respect to the locations of magnets and the volume of each of the magnets, and reflecting the results of the simulation in the manufacture of the next successive RMIM cathode iteration. Here, predetermined places in an RMIM cathode where a horizontal magnetic field component is concentrated are set as reference points P, Q, R, S, L, M, N, and O and are taken into consideration when changing the positions of the magnets.

Hereinafter, a process of manufacturing an RMIM cathode having an optimized structure according to a preferred embodiment of the present invention will be described. The thickness and width of each magnet, the diameters of the inner and outer perimeters of each of the magnets, and a distance between a rotation center and the center of each of the magnets are not limited to predetermined values or the following exemplary values, which will be presented in the following paragraphs. Moreover, the present invention is not intended to be limited to the specifications of the embodiments set forth herein.

Figure 8A:
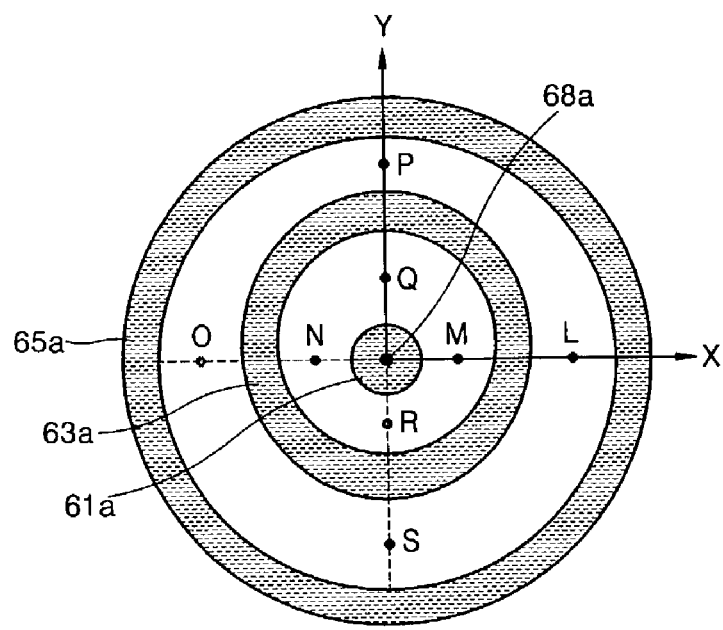
FIG. 8A illustrates a plan view of a first iteration RMIM cathode in an RMIM cathode manufacturing method according to a preferred embodiment of the present invention.

FIG. 8A illustrates a basic, first iteration RMIM cathode where a first magnet 61a is placed at a center and surrounded by a plurality of ring-shaped magnets, for example, second and third ring-shaped magnets 63a and 65a. In this first iteration, a rotation center 68a corresponds to the center of the first through third magnets 61a, 63a, and 65a. Here, adjacent magnets have opposite magnetization directions.

More particularly, the RMIM cathode is preferably manufactured so that the second magnet 63a is placed inside the third magnet 65a, which has a larger diameter than the second magnet 63a. The first through third magnets 61a, 63a, and 65a are fixed onto a non-magnetic rotation plate so that they can each perform off-axis rotation.

The first magnet 61a is cylinder-shaped and has a diameter of about 4 cm. A center of the first magnet 61a corresponds to the rotation center 68a. The second magnet 63a is ring-shaped and has a center located about 1 cm away from the rotation center 68a in a (+) direction on a y-axis. The width of the second magnet 63a, i.e., a distance between the inner and outer perimeters of the second magnet 63a, is about 2 cm, and the diameter of the outer perimeter of the second magnet 63a is about 16 cm. The third magnet 65a is ring-shaped and has a center at a position that corresponds to the rotation center 68a. The width of the third magnet 65a is about 2 cm and the diameter of the outer perimeter of the third magnet 65a is about 28 cm.

As described above, there are eight places P, Q, R, S, L, M, N, and O where a horizontal magnetic field component is concentrated, and the eight places are set as reference points for consideration in the manufacture of an optimized RMIM cathode.

Figure 8B:
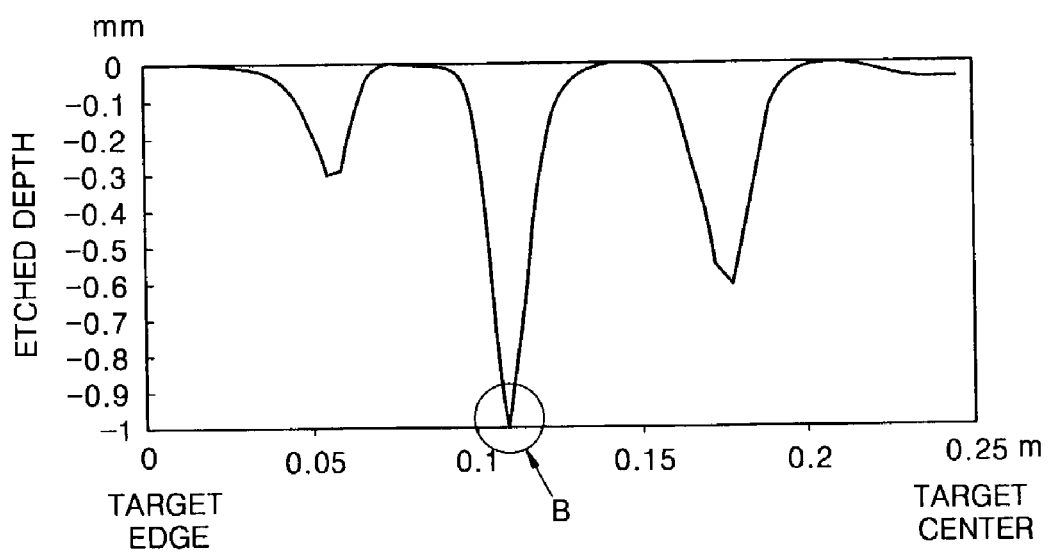
FIG. 8B is a graph showing the profile of an etched target, on which sputtering has been performed in a sputtering apparatus using the first iteration RMIM cathode shown in FIG. 8A.

FIG. 8B shows the profile of a target processed in a sputtering apparatus using the first iteration RMIM cathode shown in FIG. 8A. Referring to FIG. 8B, the amount of the target etched is greatest at a point B, which corresponds to a place on the target 0.11 m away from an edge of the target. The depth to which the target is etched at the place corresponding to the point B is 1 mm. The target is etched to a depth of 0.6 mm at a place 0.18 m away from the edge of the target and to a depth of 0.3 mm at a place 0.05 m away from the edge of the target. As shown in FIG. 8B, the target is scarcely etched between a place 0.05 m away from the edge of the target and a place 0.1 m away from the edge of the target, and at a place 0.15 m away from the edge of the target. The place corresponding to the point B in FIG. 8B is a location between the first magnet 61a and the second magnet 63a, shown in FIG. 8A, which means a horizontal magnetic field component is also concentrated on a space between the first magnet 61a and the second magnet 63a, including the places Q, R, N, and M.

After obtaining the etched target profile shown in FIG. 8B, places where a horizontal magnetic field component is concentrated are figured out, and then the shapes and arrangement of the first through third magnets 61a, 63a, and 65a are appropriately changed in an effort to optimize the RMIM electrode so that the horizontal magnetic field component is evenly distributed.

Figure 9A:
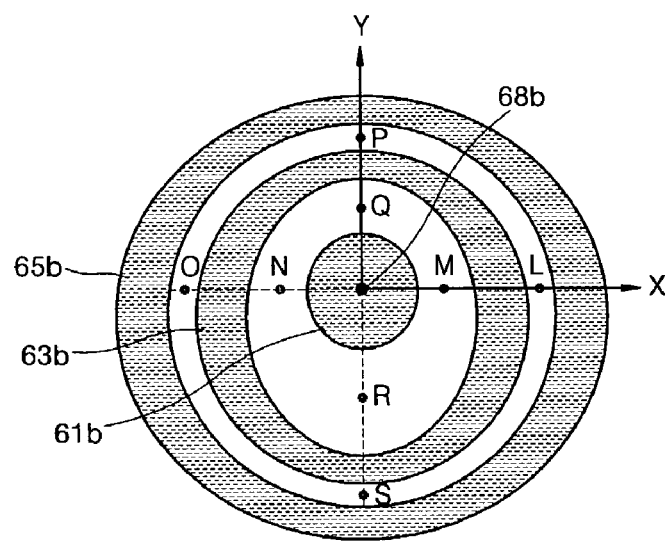
FIG. 9A illustrates a plan view of a second iteration RMIM cathode in an RMIM cathode manufacturing method according to a preferred embodiment of the present invention.

In order to evenly etch the target while preventing a specific portion of the target from being etched much more than other portions, as shown at location B in FIG. 8B, the first through third magnets 61a, 63a, and 65a are reconstructed and rearranged into first through third magnets 61b, 63b, and 65b, respectively, as shown in FIG. 9A.

Specifically, in the second iteration, the first magnet 61b, like the first magnet 61a, is cylinder-shaped and has a rotation center 68b as a center thereof. However, the diameter of the first magnet 61b is about 6 cm, which is about 2 cm greater than the diameter of the first magnet 61a.

The second magnet 63b is ring-shaped, and has a center located about 1.9 cm away from the rotation center 68b in a (−) direction on the y-axis. The second magnet 63b is designed by modifying the inner perimeter of the second magnet 63a so that a width of the second magnet 63b, i.e., the distance between the inner and outer perimeters of the second magnet 63b, gradually varies in a range between a minimum of about 1.5 cm and a maximum of about 3 cm and the diameter of the outer perimeter of the second magnet 63b is about 18.5 cm.

The third magnet 65b has a center at a location corresponding to the center of the second magnet 63b and is designed by modifying the outer perimeter of the third magnet 65a so that a width of the third magnet 65b, i.e., the distance between the inner and outer perimeters of the third magnet 65b, gradually varies in a range between a minimum of 1.5 cm and a maximum of 3 cm and the diameter of the inner perimeter of the third magnet 65b is about 21.5 cm.

Referring to FIGS. 8A and 9A, the cylinder-shaped first magnet 61b has a different location and a greater diameter than the cylinder-shaped first magnet 61a of FIG. 8A. In addition, the ring-shaped second magnet 63b shown in FIG. 9A, unlike the ring-shaped second magnet 63a shown in FIG. 8A, has a vertically elongated oval shape, and the width of the second magnet 63b gradually varies. The ring-shaped third magnet 65b shown in FIG. 9A, unlike the ring-shaped third magnet 65a shown in FIG. 8A, has a horizontally elongated oval shape, and a width that also gradually varies.

Figure 9B:
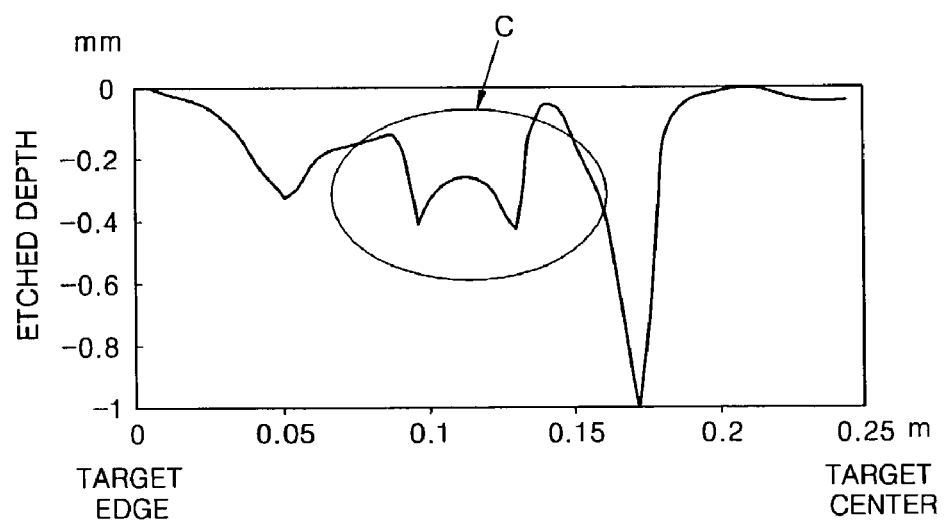
FIG. 9B is a graph showing the profile of an etched target, on which sputtering has been performed in a sputtering apparatus using the second iteration RMIM cathode shown in FIG. 9A.

FIG. 9B shows the profile of a target processed in a sputtering apparatus using the second iteration RMIM cathode shown in FIG. 9A. Referring to FIG. 9B, the amount of a target etched is greatest at a point on the target 0.17 m away from an edge of the target. FIG. 9B shows that the depth of each portion of the etched target is almost maintained at a predetermined value, i.e., about 0.5 mm, in a predetermined range C from a point 0.05 m away from the edge of the target to a point 0.18 m away from the edge of the target.

The depth of the etched target reaches peaks at places on the target that are respectively 0.05 m, 0.1 m, 1.13 m, and 0.17 m away from the edge of the target, and these four places correspond to the regions Q, N, M, and R, respectively, shown in FIG. 9A. The region where the depth of the etched target reaches a maximum, i.e., 1 mm, is a region where the regions R and P shown in FIG. 9A overlap each other during rotation of the first through third magnets 61b, 63b, and 65b about the rotation center 68b, i.e., where a horizontal magnetic field component is concentrated most.

Subsequently, the shapes of the first through third magnets 61b, 63b, and 65b are modified so that the differences in depth values among the peak points in the predetermined range C from 0.05 to 0.17 m, as shown in FIG. 9B, can be reduced and thus the etched target profile of FIG. 9B can become more even.

Figure 10A:
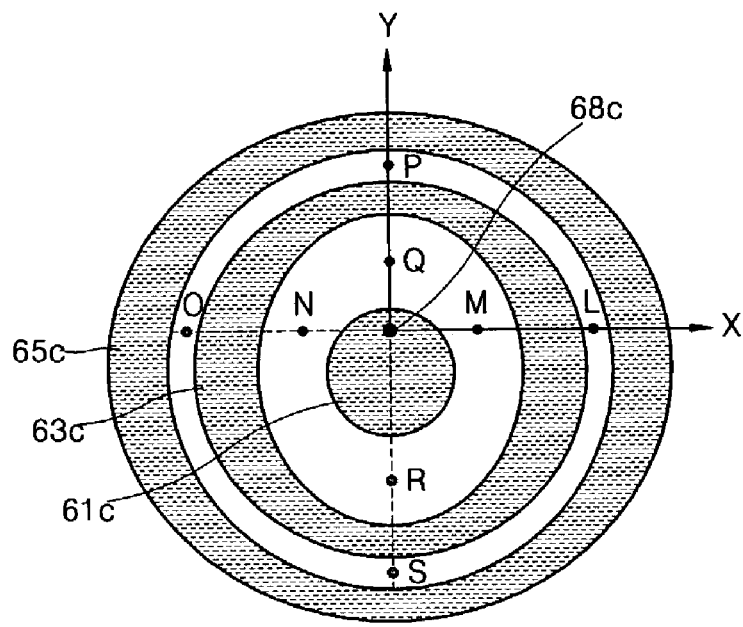
FIG. 10A illustrates a plan view of a third iteration RMIM cathode in an RMIM cathode manufacturing method according to a preferred embodiment of the present invention.
Figure 10B:
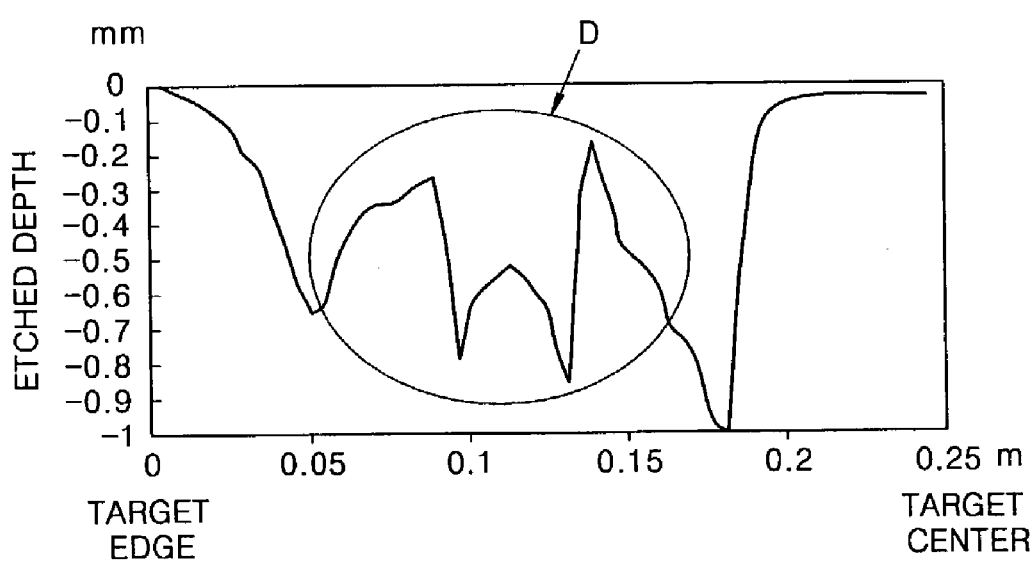
FIG. 10B is a graph showing the profile of an etched target, on which sputtering has been performed in a sputtering apparatus using the third iteration RMIM cathode shown in FIG. 10A.

FIG. 10A illustrates a plan view of a third iteration RMIM cathode that is similar to the second iteration RMIM cathode of FIG. 9A except for the location of a first magnet 63c. FIG. 10B is a graph showing the profile of a target processed in a sputtering apparatus using the third iteration RMIM cathode shown in FIG. 10A.

Referring to FIG. 10A, second and third magnets 63c and 65c remain unchanged with respect to size, shape, and center position from the second and third magnets 63b and 65b, respectively, of the second iteration RMIM cathode shown in FIG. 9A. The first magnet 61c, however, is now placed inside the second and third magnets 63c and 65c so that a center of the first magnet 61c is located 1.875 cm away from a rotation center 68c in a (−) direction on the y-axis.

FIG. 10B, like FIG. 9B, shows that the depth to which a target is etched is greatest at a point 0.17 m away from the edge of the target, and the depth of the etched target increases up to between 0.7 and 0.9 mm in a region D between a point 0.05 m away from the edge of the target and a point 0.17 m away from the edge of the target. The etched target profile of FIG. 10B generally has a greater etched depth and a more even etched depth distribution than the etched target profile of FIG. 9B.

Figure 11A:
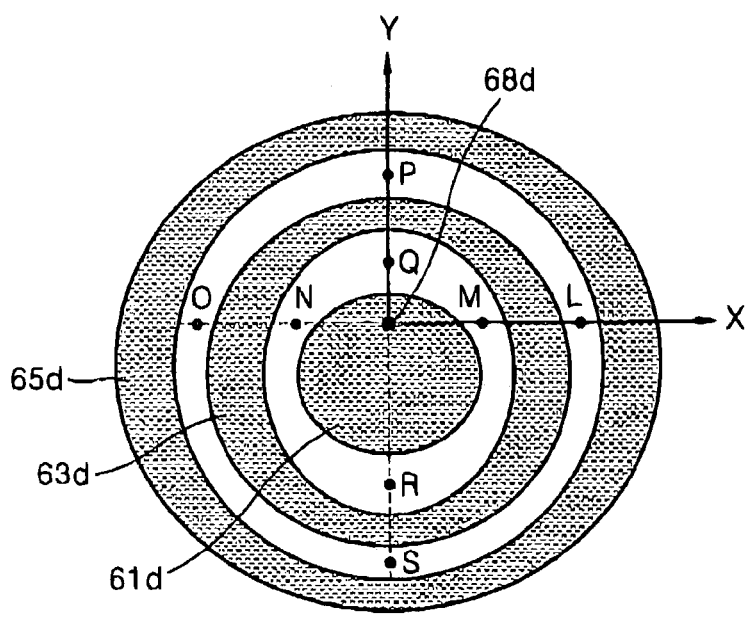
FIG. 11A illustrates a plan view of a fourth iteration RMIM cathode in an RMIM cathode manufacturing method according to a preferred embodiment of the present invention.
Figure 11B:
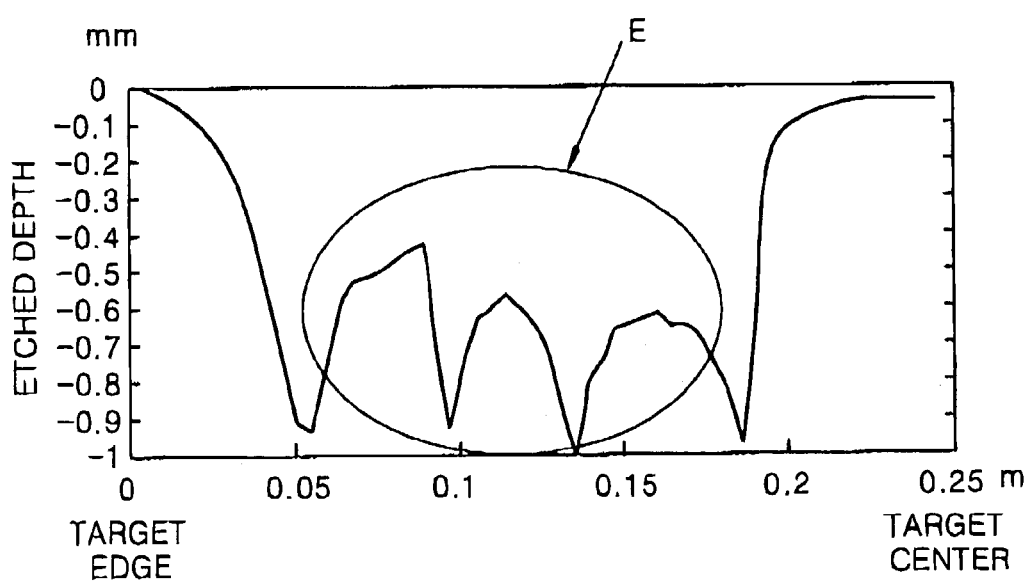
FIG. 11B is a graph showing the profile of an etched target, on which sputtering has been performed in a sputtering apparatus using the fourth iteration RMIM cathode shown in FIG. 11A.

FIG. 11A shows a fourth iteration RMIM cathode manufactured by optimizing a first magnet 61d and a second magnet 63d. FIG. 11B shows an even profile of a target processed in a sputtering apparatus using the fourth iteration RMIM cathode shown in FIG. 11A.

Referring to FIG. 11A, the first magnet 61d is cylinder-shaped and has a freely curved perimeter. The diameter of the first magnet 61d varies from a minimum of about 7.5 cm to a maximum of about 9 cm, and a center of the first magnet 61d is located about 1.875 cm away from a rotation center 68d in a (−) direction on the y-axis. The second magnet 63d is ring-shaped and has a center located about 2.375 cm away from the rotation center 68d in the (−) direction on the y-axis. The width of the second magnet 63d, i.e., the distance between the inner and outer perimeters of the second magnet 63d varies in a range between a minimum of about 1.5 cm and a maximum of about 3.0 cm. The diameter of the outer perimeter of the second magnet 63d is set to about 17.25 cm.

A third magnet 65d is also ring-shaped and remains unchanged from the third magnet 65c of FIG. 10A in terms of the location of the center, the distance between the inner and outer perimeters, and the internal diameter.

As shown in FIG. 11B, the target is almost etched to a depth of 1 mm in a region E ranging from a place 0.05 m away from the edge of the target to a place 0.18 m away from the edge of the center. In the region E, the target is almost uniformly etched, which indicates that a horizontal magnetic field component of the RMIM electrode shown in FIG. 11A is uniformly distributed.

Hereinafter, a sputtering apparatus using an RMIM electrode according to a preferred embodiment of the present invention will be described in greater detail. As described above, in this embodiment, the RMIM electrode is an RMIM cathode.

Figure 12:
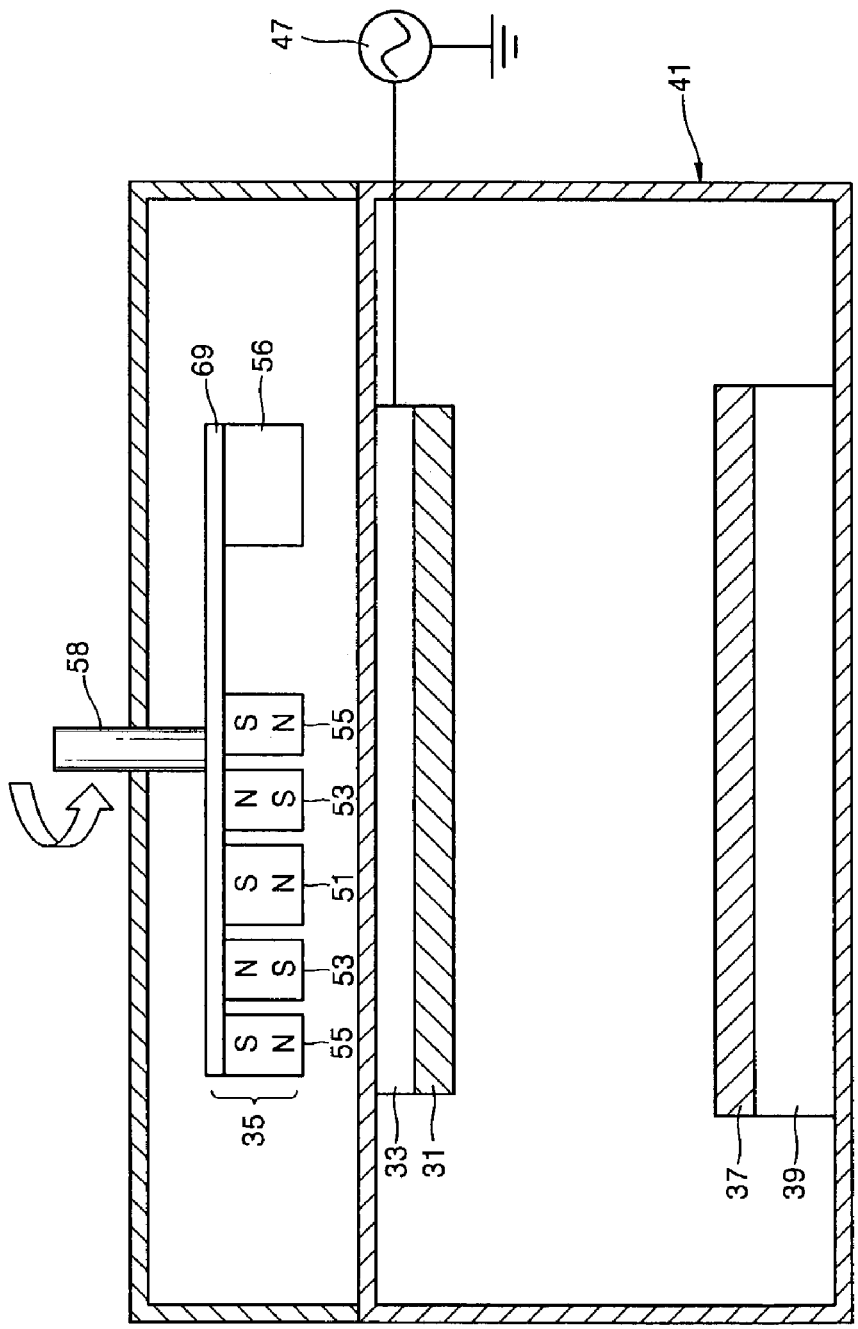
FIG. 12 illustrates a cross-sectional view of a sputtering apparatus according to a preferred embodiment of the present invention.

FIG. 12 illustrates a cross-sectional view of a sputtering apparatus using an RMIM electrode according to a preferred embodiment of the present invention. An RMIM electrode 35 includes a cylinder-shaped first magnet 51 and ring-shaped second and third magnets 53 and 55.

Referring to FIG. 12, the sputtering apparatus includes a vacuum chamber 41, a first electron unit 39 on which a wafer 37 is mounted, and a second electron unit 33 facing the wafer 37 and under which a target 31 is provided. The RMIM cathode 35 is placed behind the target 31 and includes a cylinder-shaped first magnet 51 and a plurality of ring-shaped magnets, for example, two ring-shaped magnets 53 and 55, surrounding the first magnet 51. The apparatus additionally includes a driver unit for supporting and for off-axis-rotating the RMIM cathode 35. Here, as described above, adjacent magnets have opposite magnetization directions.

The RMIM electrode 35 faces the second electrode unit 33 and includes the plurality of ring-shaped magnets 53 and 55. The sputtering apparatus further includes a power supply 47.

The driver unit includes a rotation axis 58 connected to a center of a non-magnetic rotation plate 69. An additional driving means (not shown) for driving the rotation axis 58 may be included in the sputtering device. The power supply 47 supplies current to the second electron unit 33.

In this preferred embodiment, the RMIM cathode 35 included in this apparatus is the RMIM cathode, which is optimized with respect to size, shape and arrangement, described above with reference to FIGS. 5A through 5C, and 11A.

The RMIM cathode according to the present invention may have a greater volume than a conventional cathode. If the volume of an RMIM cathode increases even though the RMIM cathode adopts the same magnets as a conventional cathode, the intensity of a magnetic field generated by the RMIM cathode increases so that secondary electrons are more effectively maintained on a target. Therefore, it is possible to more stably perform sputtering under low pressures. In a low-pressure process, the tendency of target material particles emitted from the target toward a wafer to travel in a straight direction increases, and thus the step coverage capability of the target material particles is enhanced. In addition, as the area of the RMIM cathode increases, the area of a region on the target directly affected by the sputtering increases, and thus the deposition rate of a thin film also increases.

Figure 13:
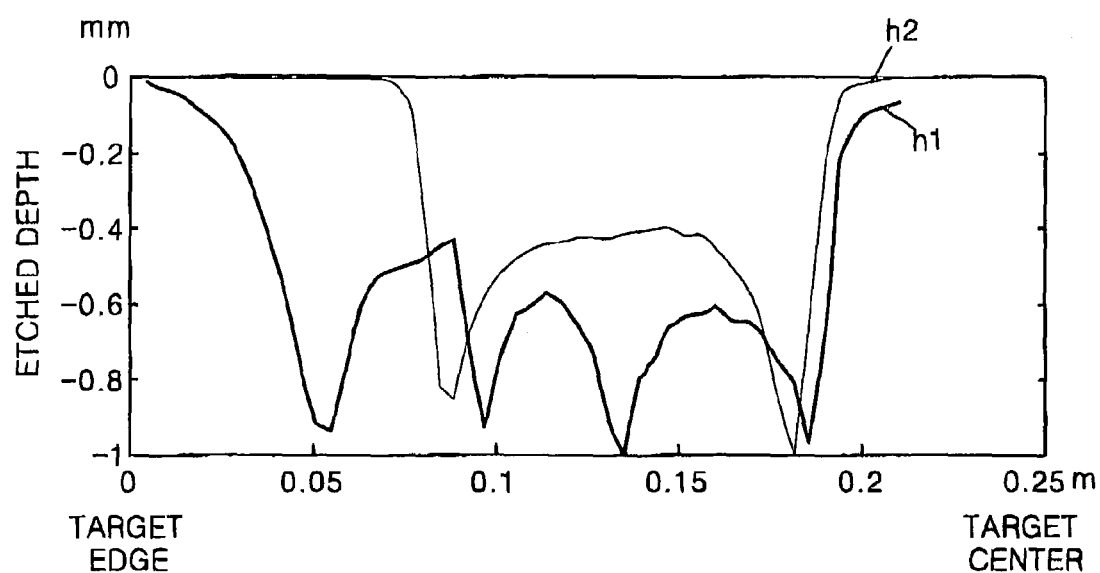
FIG. 13 is a graph comparing an etched target profile obtained using a conventional ULP cathode, which has been considered superior to other conventional magnetron cathodes, with an etched target profile obtained using an RMIM cathode according to a preferred embodiment of the present invention.

FIG. 13 is a graph comparing an etched target profile obtained using a conventional ULP cathode, which has been considered superior to other conventional magnetron cathodes, with an etched target profile obtained using an RMIM cathode according to a preferred embodiment of the present invention. Referring to FIG. 13, line h1 indicates an etched target profile of the RMIM cathode, and line h2 indicates an etched target profile of the conventional ULP cathode. As shown in FIG. 13, line h1 has a greater etched depth and a more even depth distribution than line h2. In particular, line h2 does not exceed an etched depth of 0.5 mm in a region ranging from a place 0.1 m away from the edge of a target to a place 0.18 m away from the edge of the target while line h1 almost reaches an etched depth of 1 mm. Therefore, FIG. 13 shows that the RMIM cathode according to the present invention has better performance than the conventional ULP cathode in terms of the etched target profile.

Figure 14:
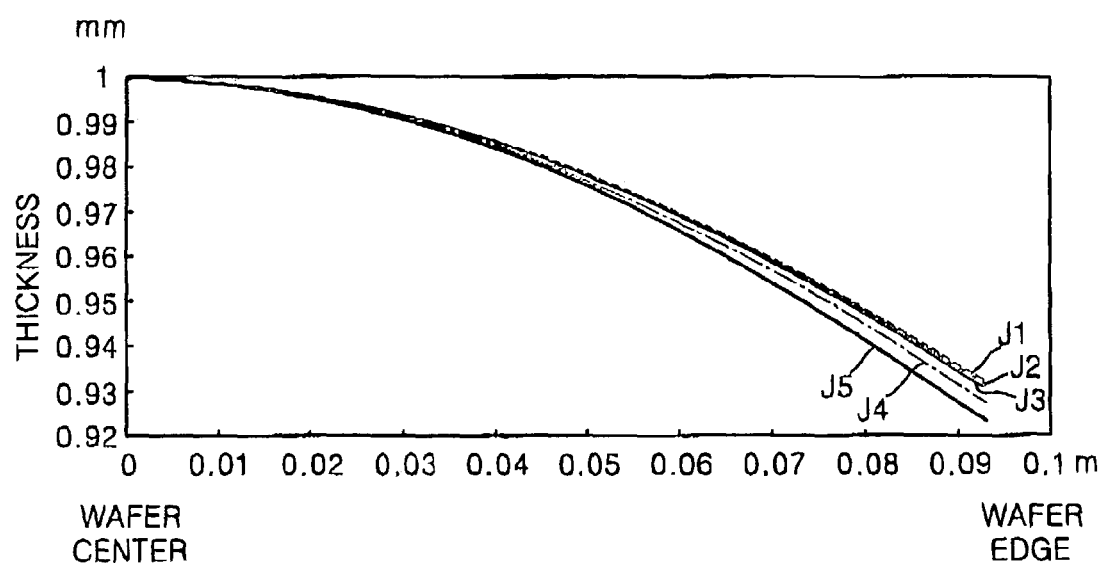
FIG. 14 is a graph comparing the thickness of each portion of a thin film formed of target material deposited on a wafer as a result of sputtering performed using an RMIM cathode according to a preferred embodiment of the present invention with the thickness of each portion of a thin film formed of target material deposited on a wafer as a result of sputtering performed using a conventional ULP cathode.

In FIG. 14, lines J1, J2, J3, J4, and J5 represent the optimized fourth iteration RMIM electrode shown in FIG. 11A, the third iteration RMIM electrode shown in FIG. 10A, the second iteration RMIM electrode shown in FIG. 9A, the first iteration RMIM electrode shown in FIG. 8A, and a conventional ULP electrode, respectively. FIG. 14 shows the variation of the thickness of a thin film deposited on a wafer using each of the optimized RMIM electrode shown in FIG. 11A, the third iteration RMIM electrode shown in FIG. 10A, the second iteration RMIM electrode shown in FIG. 9A, the first iteration RMIM electrode shown in FIG. 8A, and the conventional ULP electrode.

As shown in FIG. 14, line J1 provides the thickest film deposited on a wafer, and line J5 provides the thinnest one. The uniformity of the thickness of thin films respectively formed using line J1 through line J5 is as follows:

|  | J1 | J2 | J3 | J4 | J5 |
| --- | --- | --- | --- | --- | --- |
| Uniformity (%) | 6.6 | 6.8 | 6.9 | 7.2 | 7.7 |

Here, the uniformity of the thickness of the thin films is calculated using Equation (1) below.

$$\text{Uniformity} = \frac{\text{thickness of wafer at the center} - \text{thickness of wafer at the edge}}{\text{thickness of wafer at the center}} \times 100 \quad (1)$$

A thickness of a thin film having a small uniformity indicates that the thin film is evenly deposited on a wafer.

The RMIM cathode and the method for manufacturing the RMIM cathode according to the present invention are capable of effectively limiting motion of secondary electrons caused by $\vec{E} \times \vec{B}$ drift onto a target and places near a target by evenly distributing a horizontal magnetic field component using an RMIM cathode adopting multiple magnetic field division. In addition, according to the present invention, it is possible to increase the intensity of a magnetic field by increasing the volume of a magnetron cathode.

A sputtering apparatus including a RMIM cathode according to the present invention may be easily manufactured by reconstructing a conventional sputtering apparatus, thereby reducing manufacturing costs. In addition, the sputtering apparatus according to the present invention is capable of providing a uniformly etched target profile and enhancing step coverage of a thin film by promoting the tendency of sputtering particles to travel straight and thus uniformly depositing the sputtering particles on a wafer. Therefore, the sputtering apparatus according to the present invention can effectively perform a gap filling process required to deal with a larger-sized wafer and provide a lower line width.

As described above, the RMIM electrode according to the present invention is capable of strengthening the intensity of a magnetic field by evenly distributing a horizontal magnetic field component.

In addition, the method for manufacturing an RMIM electrode according to the present invention can provide an optimized RMIM electrode by determining and interpreting the profile of an etched target and then manufacturing an optimized RMIM electrode based on the etched target profile.

The sputtering apparatus using an RMIM electrode according to the present invention is capable of evenly etching a target and increasing the amount of the target etched. In addition, the sputtering apparatus according to the present invention is capable of enhancing step coverage of a thin film by promoting the tendency of sputtering particles to travel straight and thus uniformly depositing the sputtering particles on a wafer. Therefore, the sputtering apparatus according to the present invention can effectively perform a gap filling process required to deal with a larger-sized wafer and provide a lower line width.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, it is obvious to one skilled in the art that an RMIM cathode including magnets of different shapes from those disclosed in this disclosure can also be used.

What is claimed is:

1. A rotation magnetron-in-magnetron (RMIM) electrode comprising:
   a magnet unit including a cylinder-shaped magnet located at a center of the magnet unit and at least two ring-shaped magnets surrounding the cylinder-shaped magnet, each of the cylinder-shaped magnet and the at least two ring-shaped magnets having a center at a location that is different from a location of a center of any other magnet; and
   a driver unit for supporting and for off-axis-rotating the magnet unit,
   wherein in the magnet unit, adjacent magnets have opposite magnetization directions.

2. The RMIM electrode as claimed in claim 1, wherein the at least two ring-shaped magnets surrounding the cylinder-shaped magnet comprises a first ring-shaped magnet placed inside a second ring-shaped magnet, and a diameter of the first ring-shaped magnet is smaller than a diameter of the second ring-shaped magnet.

3. The RMIM electrode as claimed in claim 1, wherein the driver unit comprises:
   a non-magnetic rotation plate for supporting the magnetic unit; and
   a rotation axis connected to a center of the non-magnetic rotation plate for off-axis-rotating the non-magnetic rotation plate.

4. The RMIM electrode as claimed in claim 3, further comprising:
   a balance weight provided at a surface of the non-magnetic rotation plate for maintaining the non-magnetic rotation plate in balance during rotation of the non-magnetic rotation plate.

5. The RMIM electrode as claimed in claim 1, wherein each of the magnets has an asymmetric shape.

6. The RMIM electrode as claimed in claim 1, wherein a distance between each of the cylinder-shaped magnet and the at least two ring-shaped magnets is irregular around a perimeter thereof.

7. A sputtering apparatus comprising:
   a first electron unit on which a wafer is mounted;
   a second electron unit under which a target formed of a predetermined material to be deposited on the wafer is provided;
   a magnet unit placed behind the second electrode unit, the magnet unit including a cylinder-shaped magnet placed at a center of the magnet unit and at least one ring-shaped magnet surrounding the cylinder-shaped magnet, each at least one ring-shaped magnet having an asymmetric shape; and
   a driver unit for supporting and for off-axis-rotating the magnet unit,
   wherein in the magnet unit, adjacent magnets have opposite magnetization directions.

8. The sputtering apparatus as claimed in claim 7, wherein the driver unit comprises:
   a non-magnetic rotation plate for supporting the magnetic unit; and
   a rotation axis connected to a center of the non-magnetic rotation plate for off-axis-rotating the non-magnetic rotation plate.

9. The sputtering apparatus as claimed in claim 8, further comprising:
   a balance weight provided at a surface of the non-magnetic rotation plate for maintaining the non-magnetic rotation plate in balance during rotation of the non-magnetic rotation plate.

10. The sputtering apparatus as claimed in claim 7, wherein the at least one ring-shaped magnet surrounding the cylinder-shaped magnet comprises at least two ring-shaped magnets.

11. The sputtering apparatus as claimed in claim 10, wherein the at least two ring-shaped magnets surrounding the cylinder-shaped magnet comprises a first ring-shaped magnet placed inside a second ring-shaped magnet, and a diameter of the first ring-shaped magnet is smaller than a diameter of the second ring-shaped magnet.

12. The sputtering apparatus as claimed in claim 10, wherein each of the cylinder-shaped magnet and the at least two ring-shaped magnets has a center at a location that is different from a location of a center of any other magnet.

13. The RMIM electrode as claimed in claim 10, wherein a distance between each of the cylinder-shaped magnet and the at least two ring-shaped magnets is irregular round a perimeter thereof.

14. A rotation magnetron-in-magnetron (RMIM) electrode comprising:
   a magnet unit including a cylinder-shaped magnet located at a center of the magnet unit and at least one ring-shaped magnet surrounding the cylinder-shaped magnet, each at least one ring-shaped magnet having an asymmetric shape; and
   a driver unit for supporting and for off-axis-rotating the magnet unit,
   wherein in the magnet unit, adjacent magnets have opposite magnetization directions.

15. The RMIM electrode as claimed in claim 14, wherein the at least one ring-shaped magnet surrounding the cylinder-shaped magnet includes at least two ring-shaped magnets.

16. The RMIM electrode as claimed in claim 15, wherein each of the cylinder-shaped magnet and the at least two ring-shaped magnets has a center at a location that is different from a location of a center of any other magnet.

17. The RMIM electrode as claimed in claim 15, wherein a distance between each of the cylinder-shaped magnet and the at least two ring-shaped magnets is irregular around a perimeter thereof.

18. A sputtering apparatus comprising:
   a first electron unit on which a wafer is mounted;
   a second electron unit under which a target formed of a predetermined material to be deposited on the wafer is provided;
   a magnet unit placed behind the second electrode unit, the magnet unit including a cylinder-shaped magnet placed at a center of the magnet unit and at least two ring-shaped magnets surrounding the cylinder-shaped magnet, each of the cylinder-shaped magnet and the at least two ring-shaped magnets having a center at a location that is different from a location of a center of any other magnet; and
   a driver unit for supporting and for off-axis-rotating the magnet unit,
   wherein in the magnet unit, adjacent magnets have opposite magnetization directions.

* * * * *